United States Patent
Hsu et al.

(10) Patent No.: US 9,112,117 B2
(45) Date of Patent: Aug. 18, 2015

(54) HIGH BRIGHTNESS LIGHT EMITTING DIODE STRUCTURE

(71) Applicant: EPISTAR CORPORATION, Hsinchu (TW)

(72) Inventors: Chia-Liang Hsu, Hsinchu (TW); Chen Ou, Hsinchu (TW); Chun-Hsiang Tu, Hsinchu (TW); De-Shan Kuo, Hsinchu (TW); Ting-Chia Ko, Hsinchu (TW); Po-Shun Chiu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/836,681

(22) Filed: Mar. 15, 2013

(65) Prior Publication Data

US 2013/0240923 A1 Sep. 19, 2013

(30) Foreign Application Priority Data

Mar. 16, 2012 (TW) .............................. 101109277 A
Oct. 1, 2012 (TW) .............................. 101136456 A

(51) Int. Cl.
*H01L 33/00* (2010.01)
*H01L 33/46* (2010.01)
*H01L 33/20* (2010.01)
*H01L 33/40* (2010.01)
*H01L 33/42* (2010.01)
*H01L 33/38* (2010.01)

(52) U.S. Cl.
CPC .............. *H01L 33/46* (2013.01); *H01L 33/002* (2013.01); *H01L 33/20* (2013.01); *H01L 33/405* (2013.01); *H01L 33/42* (2013.01); *H01L 33/38* (2013.01); *H01L 2924/0002* (2013.01)

(58) Field of Classification Search
CPC .............................. H01L 33/46; H01L 33/002
USPC .............................................. 257/98, 99, 100
See application file for complete search history.

(56) References Cited

U.S. PATENT DOCUMENTS

| | | | |
|---|---|---|---|
| 8,373,188 B2* | 2/2013 | Suh et al. .......................... | 257/98 |
| 2011/0199772 A1* | 8/2011 | Shibusawa et al. ........... | 362/310 |
| 2011/0227114 A1* | 9/2011 | Kim et al. ........................ | 257/98 |
| 2012/0235204 A1* | 9/2012 | Hodota et al. .................. | 257/98 |
| 2012/0286240 A1* | 11/2012 | Yu et al. .......................... | 257/13 |

* cited by examiner

*Primary Examiner* — Bilkis Jahan
(74) *Attorney, Agent, or Firm* — Muncy, Geissler, Olds & Lowe, P.C.

(57) ABSTRACT

A light-emitting diode structure comprising: a substrate; a light-emitting semiconductor stack on the substrate, wherein the light-emitting semiconductor stack comprises a first semiconductor layer, a second semiconductor layer with different polarity from the first semiconductor layer, and a light-emitting layer between the first semiconductor layer and the second semiconductor layer; a first electrical pad on the substrate, wherein the first electrical pad is apart from the light-emitting semiconductor stack and electrically connects to the first semiconductor layer; and a second electrical pad on the substrate, wherein the second electrical pad is apart from the light-emitting semiconductor stack and electrically connects to the second semiconductor layer, wherein the first electrical pad and the second electrical pad are not higher than the light-emitting semiconductor stack.

20 Claims, 10 Drawing Sheets

HIGH BRIGHTNESS LIGHT EMITTING DIODE STRUCTURE

TECHNICAL FIELD

The present application relates to a structure of a light-emitting diode and a method of manufacturing thereof.

REFERENCE TO RELATED APPLICATION

This application claims the right of priority based on TW application Serial No. 101136456, filed on Oct. 1, 2012, and TW application Serial No. 101109277, filed on Mar. 16, 2012, and the content of which is hereby incorporated by reference in their entireties.

DESCRIPTION OF BACKGROUND ART

The structure and light-emitting theory of light-emitting diode (LED) are different from that of traditional light source. Comparing to conservative light source, light-emitting diode (LED) has some advantages, e.g. low power consumption, long lifetime, no warm-up time, fast responding. And, light-emitting diode (LED) has small volume and is shake-resistant, suitable for mass production and easy to be adopted in a very small unit or an array unit for application needs. Thus, light-emitting diode (LED) is adapted in various applications, e.g. optical display unit, laser diode, traffic light, data saving device, communication device, and medical device, etc.

The common array light-emitting diode shown FIG. 1 comprises a substrate 8 and a plurality of light-emitting stacks 2 comprising a second semiconductor layer 26, a light-emitting layer 24, and a first semiconductor layer 22 on the substrate 8. When the substrate 8 is insulating, the manufacturing method of the array light-emitting diode comprises the steps of forming the trench 18 between the light-emitting stacks 2 in use of etching process to make each of the light-emitting stacks 2 insulated to each other, etching a portion of each of the light-emitting stacks 2 to reveal the second semiconductor layer 26; for each light-emitting stacks 2, forming a first pad 43 on the exposed area of the second semiconductor layer 26 and a second pad 63 on the first semiconductor layer 22, and forming metal wire 19 for selectively connecting the first pad 43 and the second pad 63 of each of the light-emitting stacks 2 to connect the plurality of light-emitting stacks 2 in series or parallel.

The above light-emitting diode is able to combine with a submount to form a lighting device. The lighting device comprises a submount with at least one circuit; a solder on the submount, by which the above light-emitting diode can be fixed on the submount, and the substrate of the above light-emitting diode electrically connect to the circuit on the submount; and an electrical connecting structure for electrically connecting the pads of the light-emitting diode and the circuit on the submount; wherein the above submount could be lead frame or large mounting substrate for conveniently designing the electrical circuit of the lighting device and increasing the heat dissipation efficiency.

Currently the common light-emitting diode has internal quantum efficiency (IQE) between 50% and 80%, which means about 20% to 50% of the input power cannot be converted to light. When the light-emitting diode is packaged to form a package, a portion of light emitted from the light-emitting diode is reflected or diffused in the package and finally absorbed by the pad of the light-emitting diode. Besides, because the pad on the light-emitting diode obstructs the path of light, a portion of light cannot go outside and the brightness is therefore reduced.

SUMMARY OF THE DISCLOSURE

A light-emitting diode structure comprising: a substrate; a light-emitting semiconductor stack on the substrate, wherein the light-emitting semiconductor stack comprises a first semiconductor layer, a second semiconductor layer with different polarity from the first semiconductor layer, and a light-emitting layer between the first semiconductor layer and the second semiconductor layer; a first electrical pad on the substrate, wherein the first electrical pad is apart from the light-emitting semiconductor stack and electrically connects to the first semiconductor layer; and a second electrical pad on the substrate, wherein the second electrical pad is apart from the light-emitting semiconductor stack and electrically connects to the second semiconductor layer, wherein the first electrical pad and the second electrical pad are not higher than the light-emitting semiconductor stack.

A method of manufacturing a light-emitting diode structure, comprising the steps of: providing a substrate wherein the substrate has a second electrical conducting layer on thereof; providing a plurality of light-emitting semiconductor stacks on the substrate, wherein the plurality of light-emitting semiconductor stacks connects to the substrate by the second electrical conducting layer; forming a second electrical pad between the plurality of light-emitting semiconductor stacks and electrically connecting to the second electrical conducting layer; forming an insulating layer to cover the second electrical conducting layer and the second electrical pad; and forming a first electrical pad between the plurality of light-emitting semiconductor stacks and electrically connecting to the plurality of light-emitting semiconductor stacks.

DETAILED DESCRIPTION OF PREFERRED EMBODIMENTS

Figure 1:
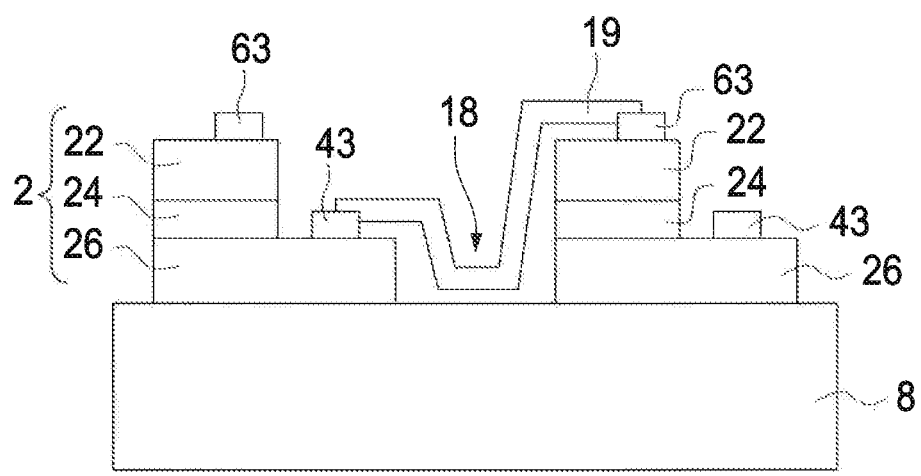
FIG. 1 schematically shows a common array light-emitting diode.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

First Embodiment

Figure 2A:
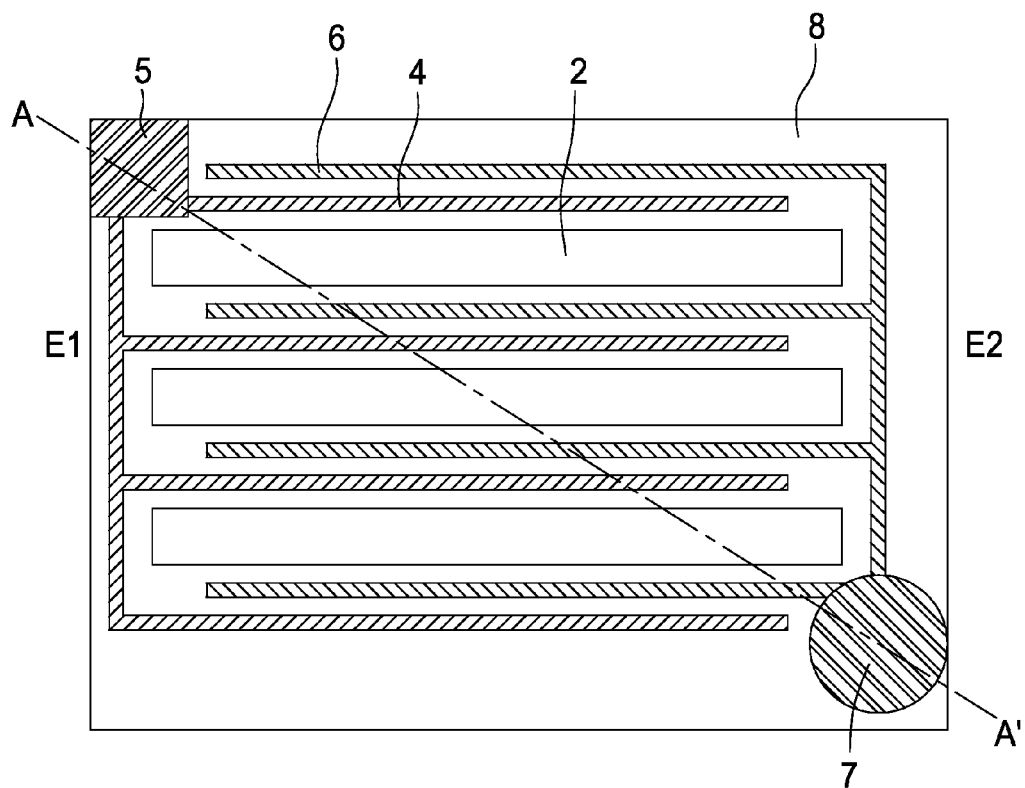
FIGS. 2A and 2B schematically show a high brightness light-emitting diode structure in accordance with the first embodiment of the present application.
Figure 2B:
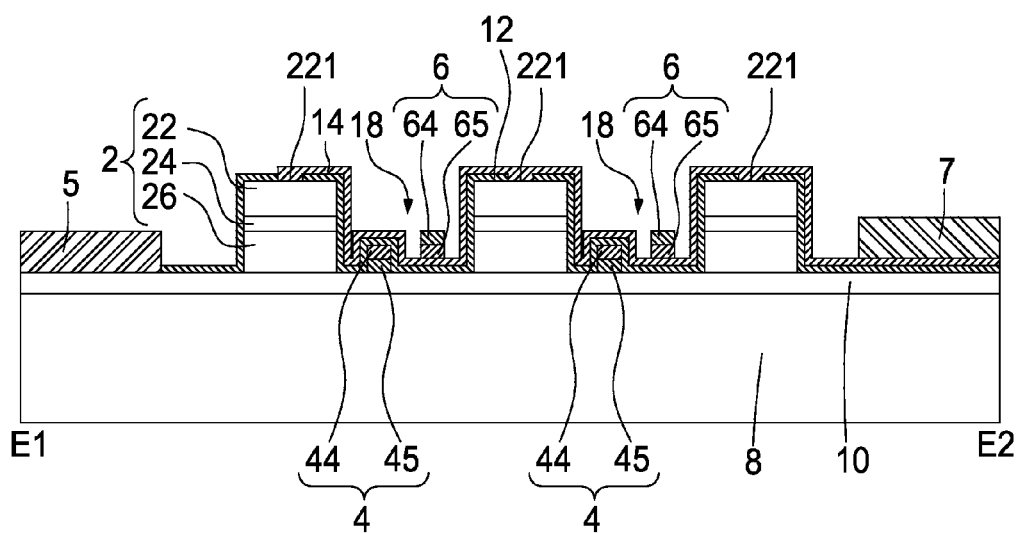

FIGS. 2A and 2B schematically show a high brightness light-emitting diode structure in accordance with the first embodiment of the present application. FIG. 2B shows the cross-section diagram of the dotted line AA' in FIG. 2A. FIG. 2A shows the top view of the high brightness light-emitting diode structure of the first embodiment. A plurality of light-emitting semiconductor stacks 2 is on a substrate 8. A second electrical pad 5 and a first electrical pad 7 are respectively on a first side E1 and a second side E2 of the substrate 8. A first electrode extension 6 and a second electrode extension 4 connect to the first electrical pad 7 and the second electrical pad 5 respectively, extend to both sides of each of the light-emitting semiconductor stacks 2, and do not directly ohmically contact with the plurality of light-emitting semiconductor stacks 2.

As FIG. 2B shows, a second electrical conducting layer 10 is on the substrate 8. The material of the substrate 8 comprises insulating material, e.g. Silicone, Glass, Quartz, Ceramic, or $AL_4N$. The material of the second electrical conducting layer 10 comprises metallic material with higher reflectivity, e.g. Ag, Au, Al, In, Sn, or the alloy thereof, or transparent conductive material, e.g. ITO, InO, SnO, GaP, or the combination thereof.

The plurality of light-emitting semiconductor stacks 2, the second electrical pad 5, and the second electrode extension 4 are on the second electrical conducting layer 10 and ohmically contact with the second electrical conducting layer 10, wherein the second electrical pad 5 is on the first side E1. Each two adjacent light-emitting semiconductor stacks 2 have a trench 18 between thereof. The second electrode extension 4 is in the trench 18 and lower than the plurality of light-emitting semiconductor stacks 2. Each of the plurality of light-emitting semiconductor stacks 2 comprises a first semiconductor layer 22, a light-emitting layer 24, and a second semiconductor layer 26. Each of the plurality of light-emitting semiconductor stacks 2 ohmically contacts with the second electrical conducting layer 10 by the second semiconductor layer 26. The second semiconductor layer 26 of each of the plurality of light-emitting semiconductor stacks 2, the second electrode extension 4 and the second electrical pad 5 therefore electrically connect to each other by the second electrical conducting layer 10. When the first semiconductor layer 22 is p-type semiconductor, the second semiconductor layer 26 can be n-type semiconductor whose polarity is different from that of the first semiconductor layer 22. On the contrary, when the first semiconductor layer 22 is n-type semiconductor, the second semiconductor layer 26 can be p-type semiconductor whose polarity is different from that of the first semiconductor layer 22. The light-emitting layer 24 between the first semiconductor layer 22 and the second semiconductor layer 26 can comprise intrinsic semiconductor. As electrical current flows through each of the plurality of light-emitting semiconductor stacks 2, the light-emitting layer 24 can emit a light. When the light-emitting layer 24 composes of the material based on AlGaInP series, the light-emitting layer 24 can emit amber series light, e.g. red light, orange light, or yellow light. When the light-emitting layer 24 composes of the material based on GaN series, the light-emitting layer 24 can emit blue light or green light. The second electrical pad 5 comprises a single-layer or a multi-layer metallic structure made of Ni, Ti, Al, Au or the combination thereof. The second electrode extension 4 comprises the metal with high electrical conductivity and high reflectivity for reflecting the light out of the plurality of light-emitting semiconductor stacks 2, e.g. a single-layer or a multi-layer metallic structure made of Al, Au, Pt, Ag, Rh or the alloy of thereof. The second electrode extension 4 can also be formed by coating a reflective layer 44 with higher reflectivity composed of metallic material, e.g. Al, Au, Pt, Ag, Rh or the alloy thereof, on a single-layer or multi-layer metallic structure 45 with high electrical conductivity composed of Ni, Ti, Al, Au or the combination thereof, wherein the reflective layer 44 can also be composed of distributed Bragg reflector (DBR) structure.

A patterned transparent insulating layer 12 is formed to cover the plurality of light-emitting semiconductor stacks 2, the second electrode extension 4 and the second electrical conducting layer 10 and expose a first surface 221 of each of the plurality of light-emitting semiconductor stacks 2 and the second electrical pad 5.

The transparent insulating layer 12 comprises organic material, e.g. Sub, BCB, PFOB, Epoxy, Acrylic Resin, COC, PMMA, PET, PC, Polyetherimide, Fluorocarbon Polymer; inorganic material, e.g. Silicone, Glass; dielectric material, e.g. $Al_2O_3$, $SiN_x$, $SiO_2$, $TiO_2$, or the combination thereof.

A first electrical conducting layer 14 is on the transparent insulating layer 12. The first electrical conducting layer 14 ohmically contacts with the first surface 221 of each of the plurality of light-emitting semiconductor stacks 2, and dose not ohmically contact with the second electrical pad 5. The first electrical conducting layer 14 comprises a transparent conductive layer which is pervious to light. The material of the transparent conductive layer comprises ITO, InO, SnO, CTO, ATO, ZnO, GaP or the combination thereof.

The first electrical pad 7 on the second side E2 of the substrate 8 and all the first electrode extensions 6 in the trenches 18 are on the first electrical conducting layer 14 and ohmically contact with the first electrical conducting layer 14. Therefore, the first electrical pad 7 and the first electrode extension 6 electrically contact with the first surface 221 of each of the plurality of light-emitting semiconductor stacks 2, and the first electrode extension 6 is lower than the plurality of light-emitting semiconductor stacks 2. The first electrical pad 7 comprises a single-layer or a multi-layer metallic structure made of Ni, Ti, Al, Au, or the combination thereof. The first electrode extension 6 comprises the metal with high electrical conductivity and high reflectivity for reflecting the light out of the plurality of light-emitting semiconductor stacks 2, e.g. a single-layer or a multi-layer metallic structure made of Al, Au, Pt, Ag, Rh, or the alloy of thereof. The first electrode extension 6 can also be formed by coating a reflective layer 64 with higher reflectivity composed of metallic material, e.g. Al, Au, Pt, Ag, Rh or the alloy thereof, on a single-layer or multi-layer metallic structure 65 with high electrical conductivity composed of Ni, Ti, Al, Au or the combination thereof, wherein the reflective layer 64 can also be composed of distributed Bragg reflector (DBR) structure.

As electrical current flows into the second electrical pad 5 and is conducted by the second electrode extension 4 to the both sides of each of the plurality of light-emitting semiconductor stacks 2. Then, the electrical current is conducted by the second electrical conducting layer 10 to flow through the plurality of light-emitting semiconductor stacks 2. Then, the electrical current is conducted by the first electrical conducting layer 14 and the first electrode extension 6 to flow out of the first electrical pad 7. Since the second electrode extension 4 and the first electrode extension 6 are capable of reflecting light, and the transparent insulating layer 12 and the first electrical conducting layer 14 are pervious to light, the light emitted from the light-emitting layer 24 of each of the plurality of light-emitting semiconductor stacks 2 is not blocked so the light extraction efficiency is improved.

Second Embodiment

Figure 3A:
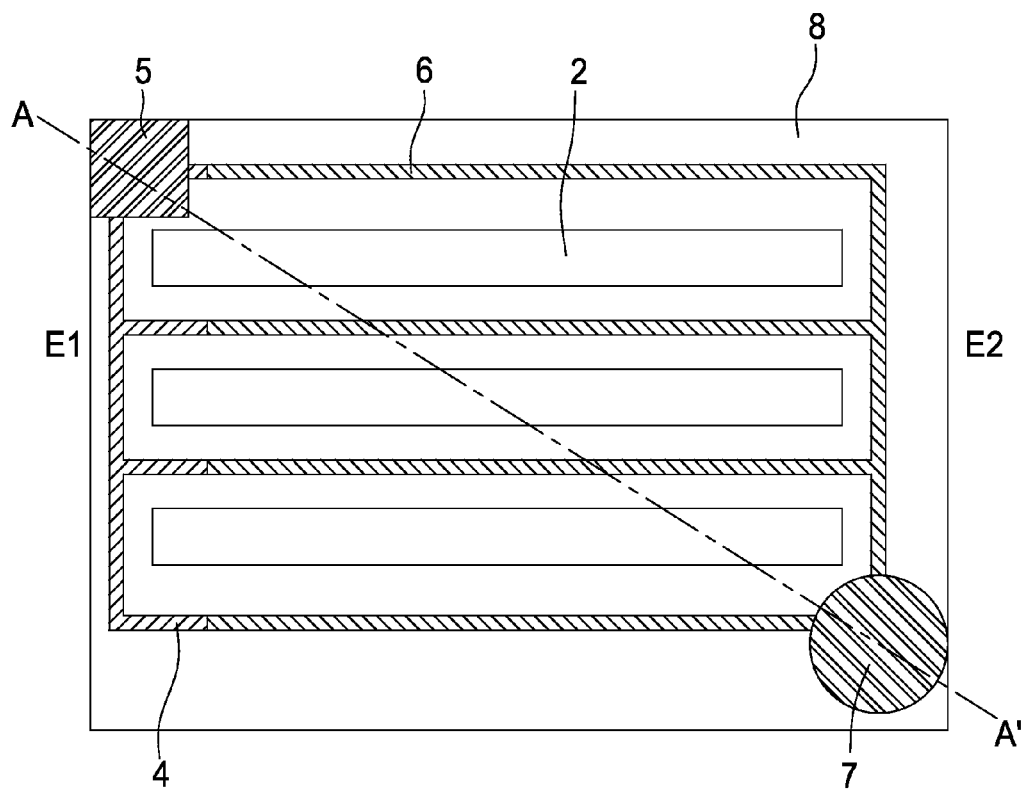
FIGS. 3A and 3B schematically show a high brightness light-emitting diode structure in accordance with the second embodiment of the present application.
Figure 3B:
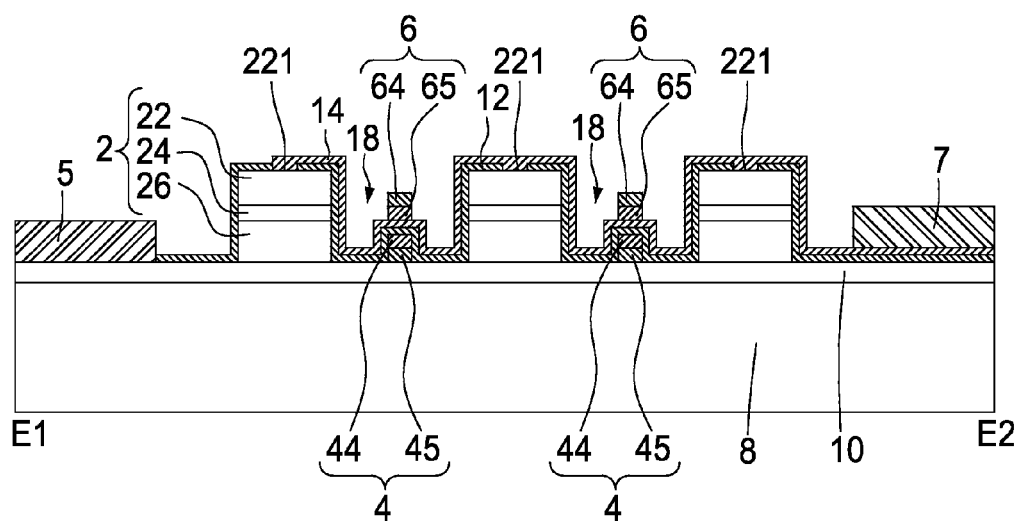

FIGS. 3A and 3B schematically show a high brightness light-emitting diode structure in accordance with the second embodiment of the present application. FIG. 3B shows the cross-sectional diagram of the dotted line AA' in FIG. 3A. The difference between the second embodiment and the first embodiment is that the first electrode extension 6 in the trenches 18 is on the second electrode extension 4 and overlaps with thereof so the height of the first electrode extension 6 overlapping together with the second electrode extension 4 is lower than that of the adjacent light-emitting semiconductor stacks 2.

Third Embodiment

Figure 4A:
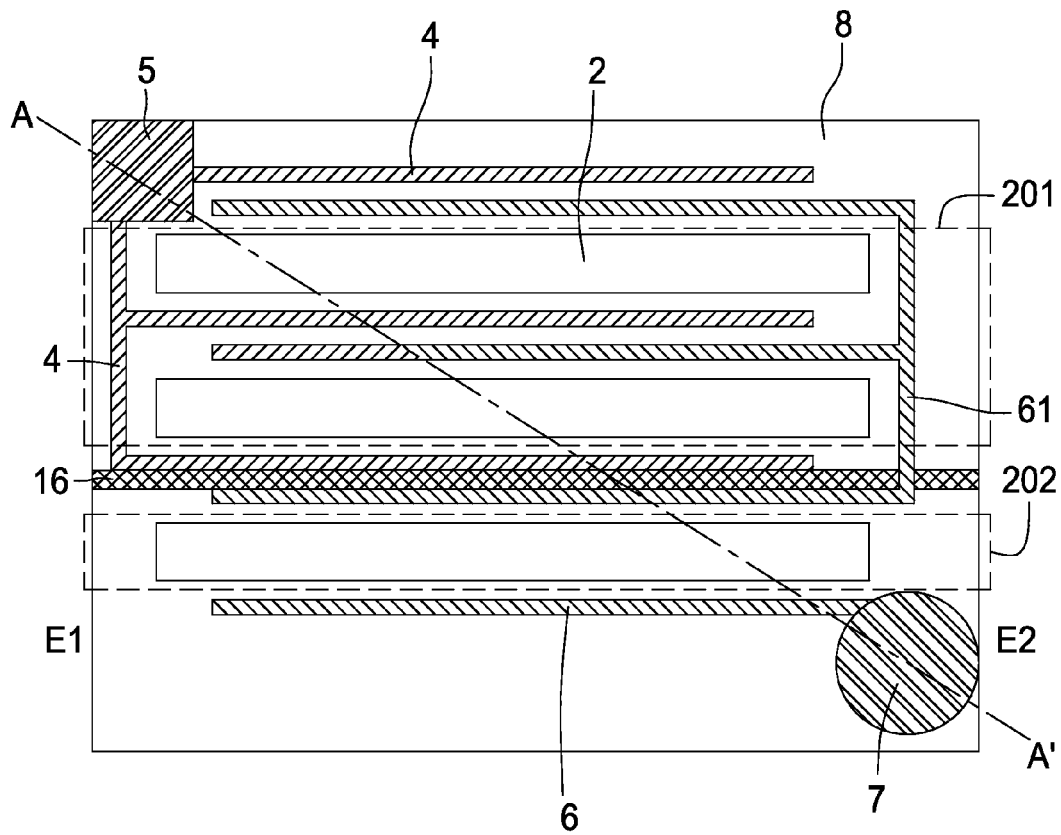
FIGS. 4A and 4B schematically show a high brightness light-emitting diode structure in accordance with the third embodiment of the present application.
Figure 4B:
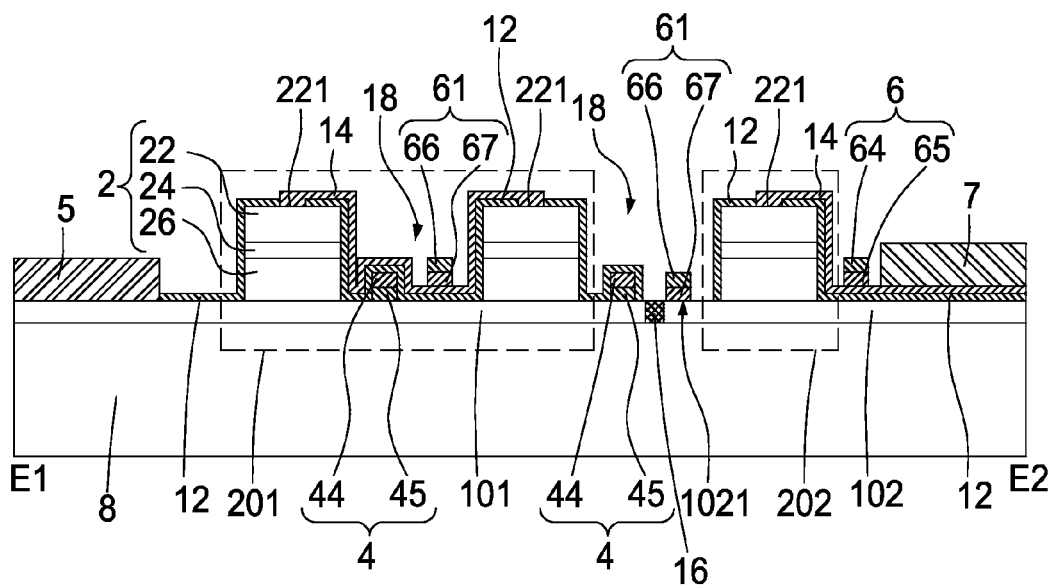

FIGS. 4A and 4B schematically show a high brightness light-emitting diode structure in accordance with the third embodiment of the present application. FIG. 4A shows the top view of the high brightness light-emitting diode structure of the third embodiment. FIG. 4B shows the cross-sectional diagram of the dotted line AA' in FIG. 4A. A plurality of light-emitting semiconductor stacks 2 is on a substrate 8 and divided into a first region 201 and a second region 202. The plurality of light-emitting semiconductor stacks 2 on the first region 201 is connected in parallel and connects the plurality of light-emitting semiconductor stacks 2 on the second region 202 in series by a series electrode 61, wherein the series electrode 61 is disposed around the plurality of light-emitting semiconductor stacks 2 and dose not directly ohmically contact with thereof. A second electrical pad 5 and a first electrical pad 7 are respectively on a first side E1 and a second side E2 of the substrate 8. A first electrode extension 6 and a second electrode extension 4 connect to the first electrical pad 7 and the second electrical pad 5 respectively, extend to both sides of each of the light-emitting semiconductor stacks 2, and do not directly ohmically contact with the plurality of light-emitting semiconductor stacks 2. The first electrode extension 6 and the second electrode extension 4 are insulated from the series electrode 61.

FIG. 4B shows the substrate comprising a first part conductive layer 101, a second part conductive layer 102, and an insulating layer 16, wherein the first part conductive layer 101 and the second part conductive layer 102 are electrically insulated by the insulating layer 16. The material of the substrate 8 comprises insulating material, e.g. Silicone, Glass, Quartz, Ceramic or $Al_xN$. The first part conductive layer 101 and the second part conductive layer 102 comprise metallic material with higher reflectivity, e.g. Ag, Au, Al, In, Sn or the alloy thereof, or transparent conductive material, e.g. ITO, InO, SnO, GaP or the combination thereof. The insulating layer 16 comprises Spin-on Glass (SOG), Silicones, BCB, Epoxy, Polyimide or PFCB. The plurality of light-emitting semiconductor stacks 2 in the first region 201, the second electrical pad 5, and the second electrode extension 4 are on the first part conductive layer 101 and ohmically contact with thereof. The plurality of light-emitting semiconductor stacks 2 in the second region 202 is on the second part conductive layer 102 and ohmically contacts with thereof.

Every two adjacent light-emitting semiconductor stacks 2 have a trench 18 between thereof. The second electrode extension 4 is in the trenches 18 and lower than the plurality of light-emitting semiconductor stacks 2. Each of the plurality of light-emitting semiconductor stacks 2 comprises a first semiconductor layer 22, a light-emitting layer 24, and a second semiconductor layer 26. Each of the plurality of light-emitting semiconductor stacks 2 in the first region 201 ohmically contacts with the first part conductive layer 101 by the second semiconductor layer 26. Each of the plurality of light-emitting semiconductor stacks 2 in the second region 202 ohmically contacts with the second part conductive layer 102 by the second semiconductor layer 26. Therefore, the second semiconductor layer 26 of each of the plurality of light-emitting semiconductor stacks 2 in the first region 201, the second electrode extension 4, and the second electrical pad 5 electrically connect to each other by the first part conductive layer 101.

When the first semiconductor layer 22 is a p-type semiconductor, the second semiconductor layer 26 is an n-type semiconductor which has different polarity from that of the first semiconductor layer 22. On the contrary, when the first semiconductor layer 22 is an n-type semiconductor, the second semiconductor layer 26 is a p-type semiconductor which has different polarity from that of the first semiconductor layer 22. The light-emitting layer 24 between the first semiconductor layer 22 and the second semiconductor layer 26 can be an intrinsic semiconductor. As electrical current flows through each of the plurality of light-emitting semiconductor stacks 2, the light-emitting layer 24 can emit a light. When the light-emitting layer 24 composes of the material based on AlGaInP series, the light-emitting layer 24 can emit amber series light, e.g. red light, orange light, or yellow light. When the light-emitting layer 24 composes of the material based on GaN series, the light-emitting layer 24 can emit blue light or green light. The second electrical pad 5 comprises a single-layer or a multi-layer metallic structure made of Ni, Ti, Al, Au or the combination thereof. The second electrode extension 4 comprises the metal with high electrical conductivity and high reflectivity for reflecting the light out of the plurality of light-emitting semiconductor stacks 2, e.g. a single-layer or a multi-layer metallic structure made of Al, Au, Pt, Ag, Rh or the alloy of thereof. The second electrode extension 4 can also be formed by coating a reflective layer 44 with higher reflectivity composed of metallic material, e.g. Al, Au, Pt, Ag, Rh or the alloy thereof, on a single-layer or multi-layer metallic structure 45 with high electrical conductivity composed of Ni, Ti, Al, Au or the combination thereof, wherein the reflective layer 44 can also be composed of distributed Bragg reflector (DBR) structure.

A patterned transparent insulating layer 12 is formed to cover the plurality of light-emitting semiconductor stacks 2, the second electrode extension 4, the first part conductive layer 101, and the second part conductive layer 102. A first surface 221 of each of the plurality of light-emitting semiconductor stacks 2, a partial region 1021 of the second part conductive layer 102, and the second electrical pad 5 are not covered by the transparent insulating layer 12.

The transparent insulating layer 12 comprises organic material, e.g. Sub, BCB, PFOB, Epoxy, Acrylic Resin, COC, PMMA, PET, PC, Polyetherimide, Fluorocarbon Polymer; inorganic material, e.g. Silicone, Glass; dielectric material, e.g. $Al_2O_3$, $SiN_x$, $SiO_2$, $TiO_2$, or the combination thereof.

A patterned first electrical conducting layer 14 is on the transparent insulating layer 12 wherein the first electrical conducting layer 14 in the first region 201 dose not connect to the first electrical conducting layer 14 in the second region 202. In the first region 201, the first electrical conducting layer 14 ohmically contacts with the first surface 221 of each of the plurality of light-emitting semiconductor stacks 2, and dose not ohmically contact with the second electrical pad 5. In the second region 202, the first electrical conducting layer 14 ohmically contacts with the first surface 221 of each of the plurality of light-emitting semiconductor stacks 2, and the plurality of light-emitting semiconductor stacks 2 electrically connects to the first electrical pad 7 on the second side E2 of the substrate 8 and the first electrode extension 6 by the first electrical conducting layer 14. The first electrical conducting layer 14 comprises a transparent conductive layer which is pervious to light. The material of the transparent conductive layer comprises ITO, InO, SnO, CTO, ATO, ZnO, GaP or the combination thereof. The first electrical pad 7 comprises a single-layer or a multi-layer metallic structure made of Ni, Ti, Al, Au or the combination thereof.

The series electrode 61 in the trenches 18 ohmically contacts with the first electrical conducting layer 14 in the first region 201 and the second part conductive layer 102 so the series electrode 61 electrically connects to the second semiconductor layer 26 of each of the plurality of light-emitting semiconductor stacks 2 in the second region 202, wherein the series electrode 61 dose not overlap with the second electrode extension 4, and the heights of the series electrode 61 and the second electrode extension 4 are both lower than that of the adjacent light-emitting semiconductor stacks 2.

The first electrode extension 6, the second electrode extension 4, and the series electrode 61 comprise the metal with high electrical conductivity and high reflectivity for reflecting the light out of the plurality of light-emitting semiconductor stacks 2, e.g. a single-layer or a multi-layer metallic structure made of Al, Au, Pt, Ag, Rh or the alloy of thereof. The first electrode extension 6, the second electrode extension 4, and the series electrode 61 can also be formed by coating a reflective layer 44, 64, 66 with higher reflectivity composed of metallic material, e.g. Al, Au, Pt, Ag, Rh or the alloy thereof, on a single-layer or multi-layer metallic structure 45, 65, 67 with high electrical conductivity composed of Ni, Ti, Al, Au or the combination thereof, wherein the reflective layer 44, 64, 66 can also be composed of distributed Bragg reflector (DBR) structure.

The electrical current flows into the second electrical pad 5 and is conducted by the second electrode extension 4 to the both sides of each of the plurality of light-emitting semiconductor stacks 2 in the first region 201. Then, the electrical current is conducted by the first part conductive layer 101 to flow through the plurality of light-emitting semiconductor stacks 2 in the first region 201. Then, the electrical current is conducted by the first electrical conducting layer 14 and the series electrode 61 to flow to the second part conductive layer 102. As the electrical current flows through the plurality of light-emitting semiconductor stacks 2 in the second region 202, the electrical current is conducted by the first electrical conducting layer 14 in the second region 202 to flow to the first electrode extension 6 and flow out of the first electrical pad 7. Since the second electrode extension 4, the series electrode 61, and the first electrode extension 6 are capable of reflecting light, and the transparent insulating layer 12 and the first electrical conducting layer 14 are pervious to light, the light emitted from the light-emitting layer 24 of each of the plurality of light-emitting semiconductor stacks 2 is not blocked and reflected by the second electrode extension 4, the series electrode 61, and the first electrode extension 6 so the light extraction efficiency is improved.

Fourth Embodiment

Figure 5A:
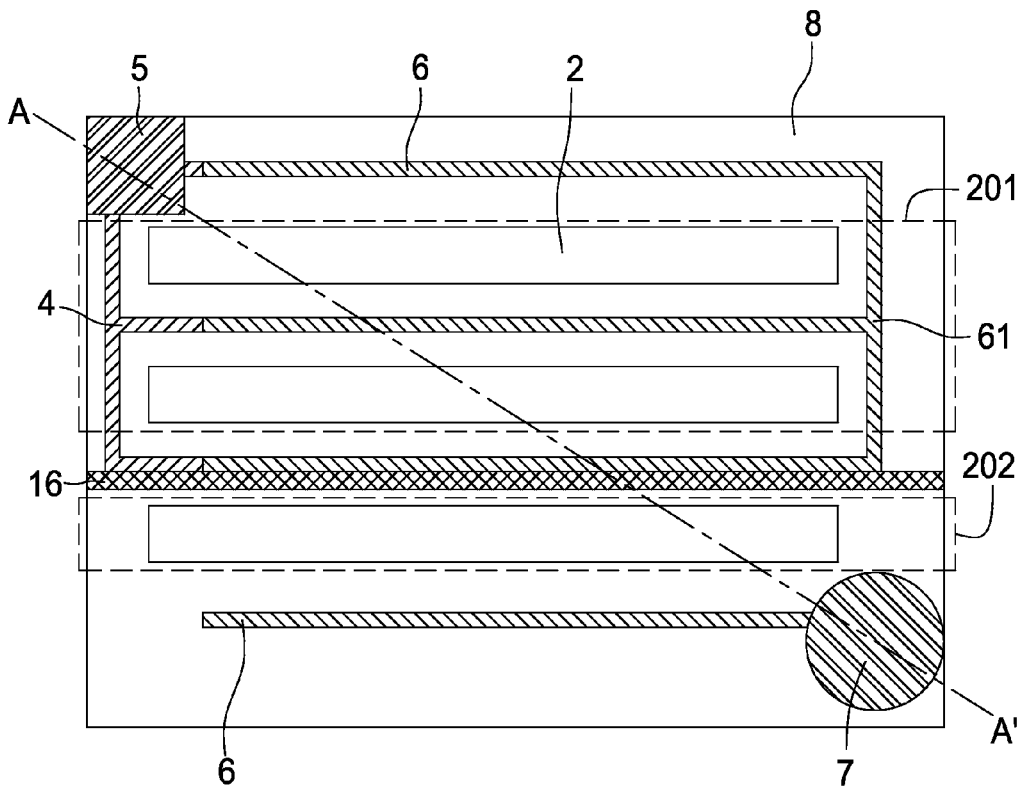
FIGS. 5A and 5B schematically show a high brightness light-emitting diode structure in accordance with the fourth embodiment of the present application.
Figure 5B:
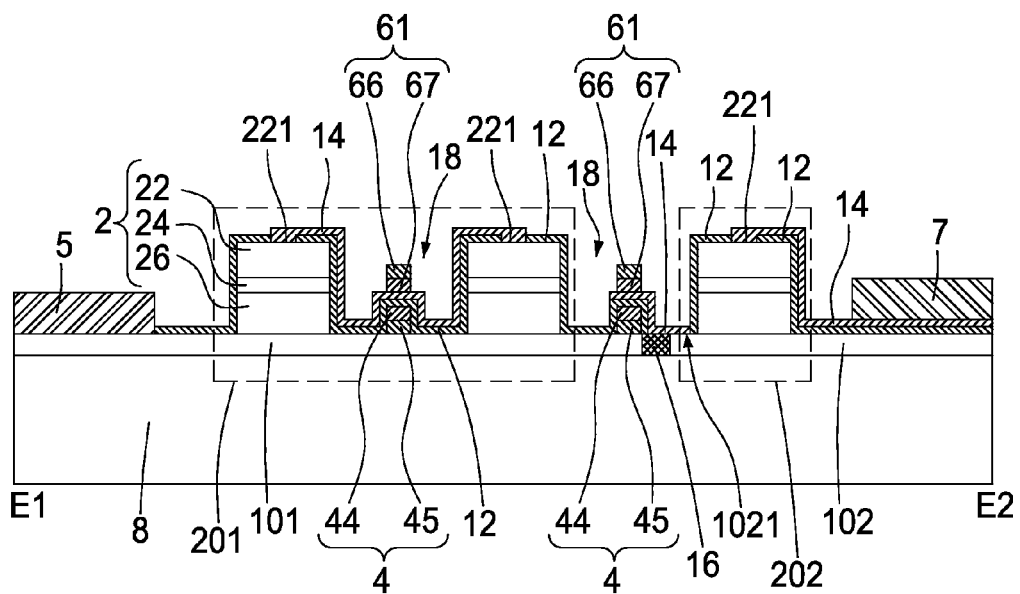

FIGS. 5A and 5B schematically show a high brightness light-emitting diode structure in accordance with the fourth embodiment of the present application. FIG. 5A shows the top view of the high brightness light-emitting diode structure of the fourth embodiment. FIG. 5B shows the cross-sectional diagram of the dotted line AA' in FIG. 5A. The difference between the fourth embodiment and the third embodiment is that the series electrode 61 in the trench 18 is on the second electrode extension 4 and overlaps with thereof. Then, the height of the series electrode 61 overlapping together with the second electrode extension 4 is lower than that of the adjacent light-emitting semiconductor stacks 2. In the fourth embodiment, the series electrode 61 ohmically contacts with the first electrical conducting layer 14 and the first electrical conducting layer 14 ohmically contacts with a portion of the second part conductive layer 102 so the series electrode 61 electrically connects to the second semiconductor layer 26 of each of the plurality of light-emitting semiconductor stacks 2 in the second region 202.

Fifth Embodiment

Figure 7A:
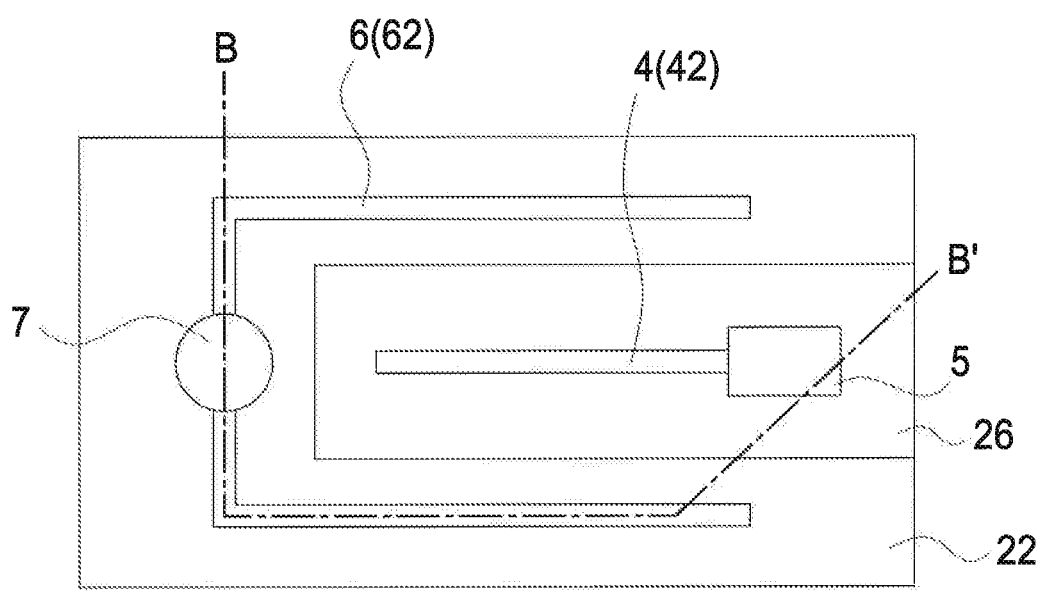
FIGS. 7A to 7E schematically show a high brightness light-emitting diode structure in accordance with the fifth embodiment of the present application.

FIGS. 7A to 7E schematically show a high brightness light-emitting diode structure in accordance with the fifth embodiment of the present application. FIGS. 7B to 7E show the cross-sectional diagram of the dotted line BB' in FIG. 7A. FIG. 7A is the top view of the high brightness light-emitting diode structure. A first electrical pad 7 and a second electrical pad 5 are on a first semiconductor layer 22 and a second semiconductor layer 26 respectively. A first electrode extension 6 and a second electrode extension 4 connect to the first electrical pad 7 and the second electrical pad 5 respectively and extend to the regions of the first semiconductor layer 22 and the second semiconductor layer 26 uncovered by the first electrical pad 7 and the second electrical pad 5 for increasing the current spreading area, wherein the first electrode extension 6 and the second electrode extension 4 are covered by a first reflective layer 62 and a second reflective layer 42 respectively. When the high brightness light-emitting diode structure is packaged in a package unit, the first reflective layer 62 and the second reflective layer 42 are capable of reflecting the light off the package unit, in which the light is reflected or diffused to avoid being absorbed by the first electrode extension 6 and the second electrode extension 4.

Figure 7B:
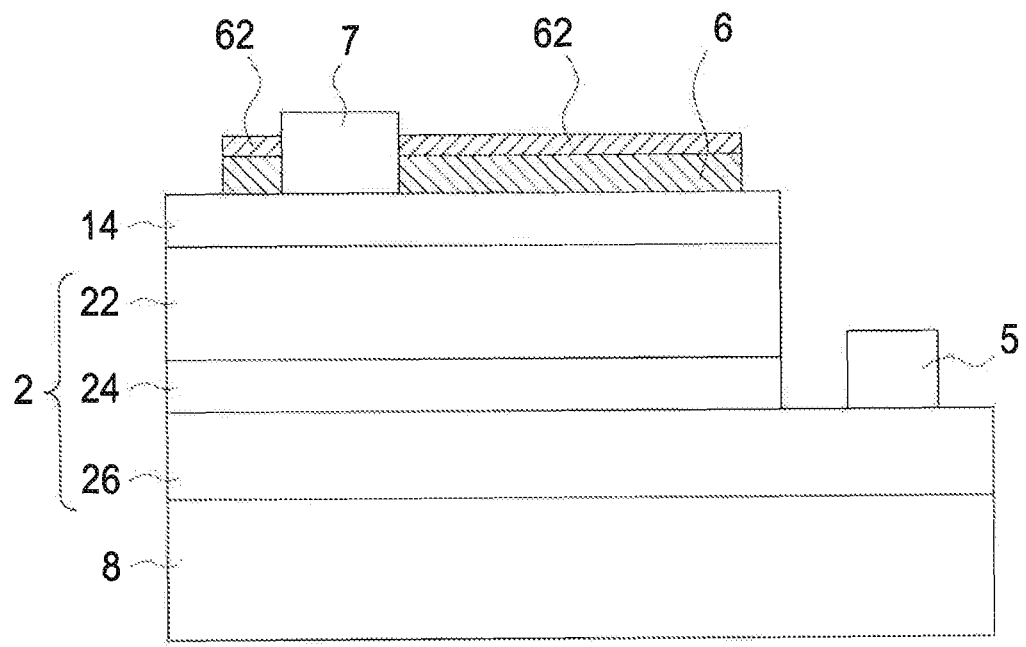

FIG. 7B shows that a light-emitting semiconductor stack 2 on a substrate 8 comprises a light-emitting layer 24 between the first semiconductor layer 22 and the second semiconductor layer 26. When the first semiconductor layer 22 is a p-type semiconductor, the second semiconductor layer 26 is an n-type semiconductor which has different polarity from that of the first semiconductor layer 22. On the contrary, when the first semiconductor layer 22 is an n-type semiconductor, the second semiconductor layer 26 is a p-type semiconductor which has different polarity from that of the first semiconductor layer 22. The light-emitting layer 24 between the first semiconductor layer 22 and the second semiconductor layer 26 can be an intrinsic semiconductor. As electrical current flows through each of the plurality of light-emitting semiconductor stacks 2 and the light-emitting layer 24 can emit a light. When the light-emitting layer 24 composes of the material based on AlGaInP series, the light-emitting layer 24 can emit amber series light, e.g. red light, orange light, or yellow light. When the light-emitting layer 24 composes of the material based on GaN series, the light-emitting layer 24 can emit blue light or green light. A first electrical conducting layer 14 is formed on the first semiconductor layer 22. The first electrical conducting layer 14 comprises a transparent conductive layer which is pervious to light. The material of the transparent conductive layer comprises ITO, InO, SnO, CTO, ATO, ZnO, GaP or the combination thereof. A second electrical pad 5 and the second electrode extension (not shown) are formed on the second semiconductor layer 26 and ohmically contact with thereof. The first electrical pad 7 and the first electrode extension 6 are formed on the first electrical conducting layer 14 and ohmically contact with thereof.

The first electrical pad 7 and the second electrical pad 5 comprise a single-layer or a multi-layer metallic structure made of Ni, Ti, Al, Au or the combination thereof. The first electrode extension 6 and the second electrode extension (not shown) comprise the metal with high electrical conductivity, e.g. a single-layer or a multi-layer metallic structure made of Ni, Ti, Al, Au or the combination thereof. The first electrode extension 6 and the second electrode extension (not shown) are covered by the first reflective layer 62 and the second reflective layer (not shown) for reflecting the light out of the light-emitting semiconductor stacks 2. The reflectivities of the first reflective layer 62 and the second reflective layer (not shown) are higher than that of the first electrical pad 7, the second electrical pad 5, the first electrode extension 6 and the second electrode extension (not shown). In one embodiment, the first reflective layer 62 and the second reflective layer (not shown) comprise metallic material or distributed Bragg reflector (DBR), wherein the metallic material comprises Al, Au, Pt, Ag, Rh or the combination thereof, and the material of distributed Bragg reflector (DBR) comprises organic material, e.g. polyimide, BCB, PFOB, Sub, Epoxy, Acrylic Resin, COC, PMMA, PET, PC, Polyetherimide or Fluorocarbon Polymer, or inorganic material, e.g. ITO, MgO, Silicone, Glass, $Al_2O_3$, $SiO_2$, $TiO_2$, $SiN_x$ or SOG. As shown in FIG. 7B, the first electrical pad 7 and the first electrode extension 6 are formed in different processing steps so the thickness of the first electrical pad 7 is larger than the total thickness of the first electrode extension 6 adding the first reflective layer 62.

Figure 7C:
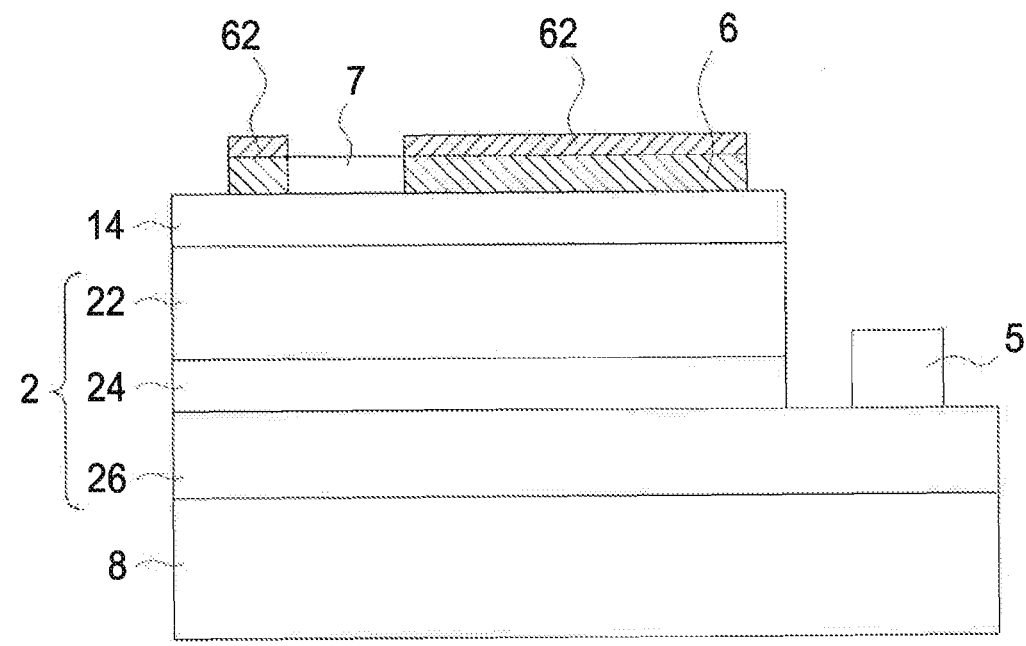

As shown in FIG. 7C, in another embodiment, the first electrical pad 7 and the first electrode extension 6 are formed in the same processing step, and then the first reflective layer 62 is formed to cover the first electrode extension 6 and exposes the first electrical pad 7 for wire bonding so the first reflective layer 62 is higher than the first electrical pad 7.

Figure 7D:
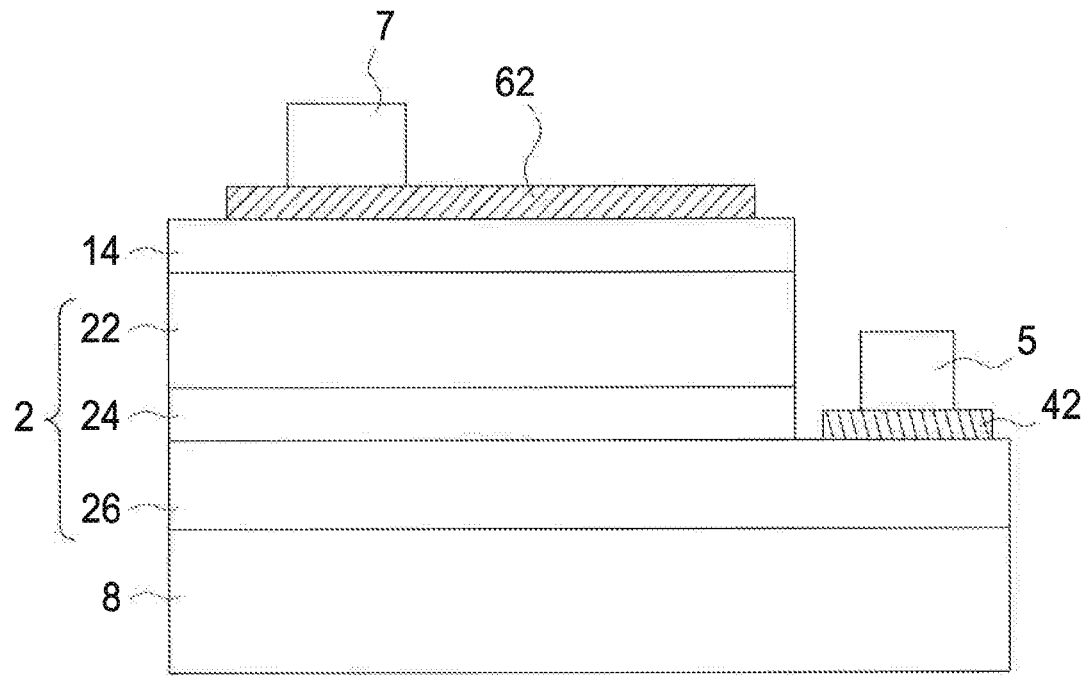

As shown in FIG. 7D, the first reflective layer 62 is directly formed on the first electrical conducting layer 14 to replace the first electrode extension 6. The second reflective layer 42 is directly formed on the second semiconductor layer 26 to replace the second electrode extension 4. Then, the first electrical pad 7 and second electrical pad 5 are formed on the first reflective layer 62 and the second reflective layer 42 respectively and electrically connect to the first reflective layer 62 and the second reflective layer 42 respectively for wire bonding. The first reflective layer 62 and the second reflective layer 42 comprise metal, e.g. Al, Au, Pt, Ag, Rh or the alloy thereof.

Figure 7E:
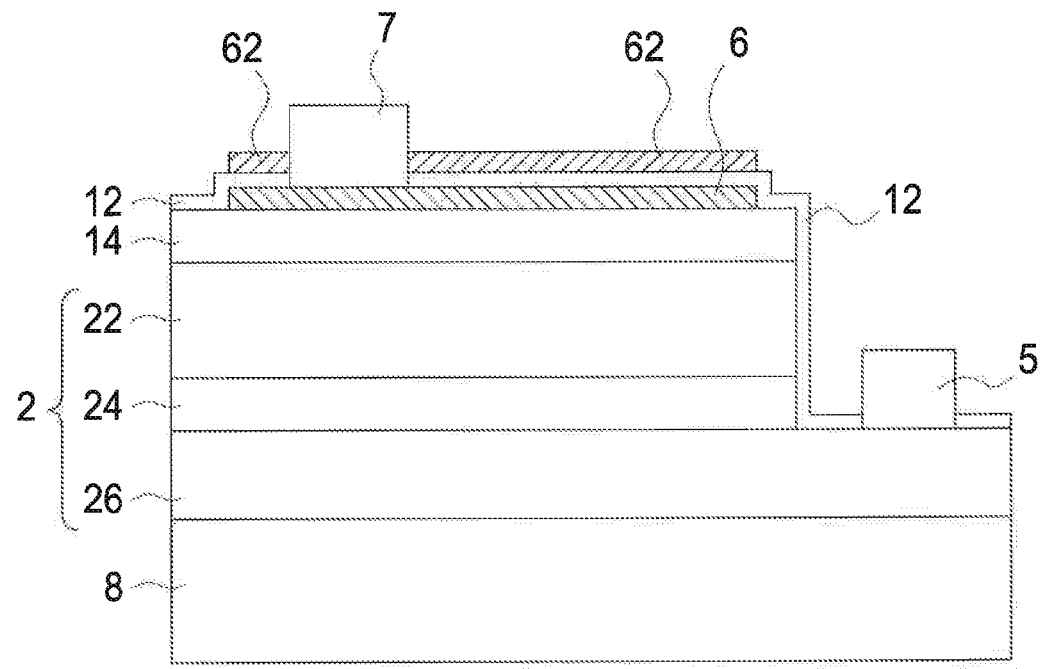

As shown in FIG. 7E, a transparent insulating layer 12 is formed on the light-emitting semiconductor stacks 2 to cover the first electrical conducting layer 14, the first electrode extension 6, and the second electrode extension (not shown) and expose the first electrical pad 7 and second electrical pad 5 for wire bonding. The transparent insulating layer 12 comprises organic material, e.g. Sub, BCB, PFOB, Epoxy, Acrylic Resin, COC, PMMA, PET, PC, Polyetherimide, Fluorocarbon Polymer; inorganic material, e.g. Silicone, Glass; dielectric material, e.g. $Al_2O_3$, $SiN_x$, $SiO_2$, $TiO_2$, or the combination thereof. Then, on the transparent insulating layer 12, the first reflective layer 62 and the second reflective layer (not shown) are formed on the first electrode extension 6 and the second electrode extension 4 respectively. The first reflective layer 62 and the second reflective layer (not shown) comprise distributed Bragg reflector (DBR), wherein the material of distributed Bragg reflector (DBR) comprises organic material, e.g. polyimide, BCB, PFOB, Sub, Epoxy, Acrylic Resin, COC, PMMA, PET, PC, Polyetherimide or Fluorocarbon Polymer, or inorganic material, e.g. ITO, MgO, Silicone, Glass, $Al_2O_3$, $SiO_2$, $TiO_2$, $SiN_x$ or SOG.

Process Embodiment

Figure 6A:
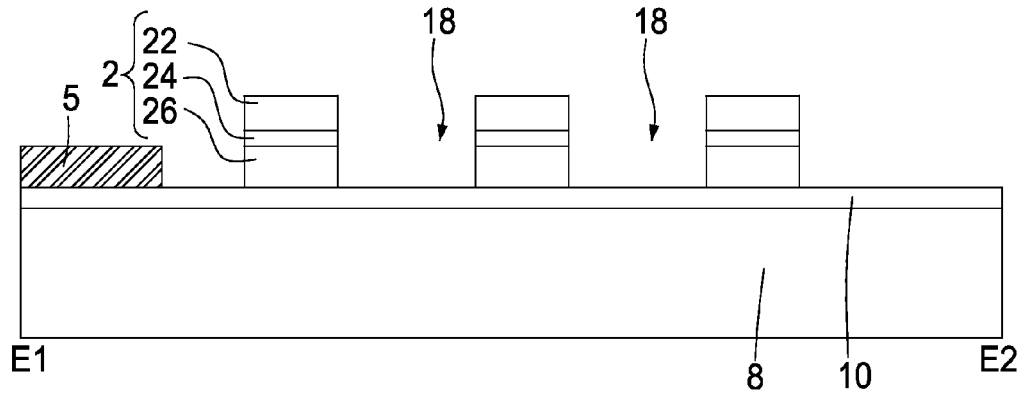
FIGS. 6A to 6E schematically show a method of manufacturing a high brightness light-emitting diode structure in accordance with one embodiment of the present application.

FIGS. 6A to 6E schematically show a method of manufacturing a high brightness light-emitting diode structure in accordance with one embodiment of the present application. As shown in FIG. 6A, a substrate 8 is provided with a second electrical conducting layer 10 formed thereon, and a plurality of light-emitting semiconductor stacks 2 is on the second electrical conducting layer 10 and ohmically contacts with thereof, wherein every two adjacent light-emitting semiconductor stacks 2 have a trench 18 between thereof. The material of the substrate 8 comprises insulating material, e.g. Silicone, Glass, quartz, ceramic or $AL_4N$. The material of the second electrical conducting layer 10 comprises metallic material with higher reflectivity, e.g. Ag, Au, Al, In, Sn or the alloy thereof, or transparent conductive material, e.g. ITO, InO, SnO, GaP or the combination thereof. Each of the plurality of light-emitting semiconductor stacks 2 comprises a first semiconductor layer 22, a light-emitting layer 24, and a second semiconductor layer 26. Each of the plurality of light-emitting semiconductor stacks 2 ohmically contacts with the second electrical conducting layer 10 by the second semiconductor layer 26.

Figure 6B:
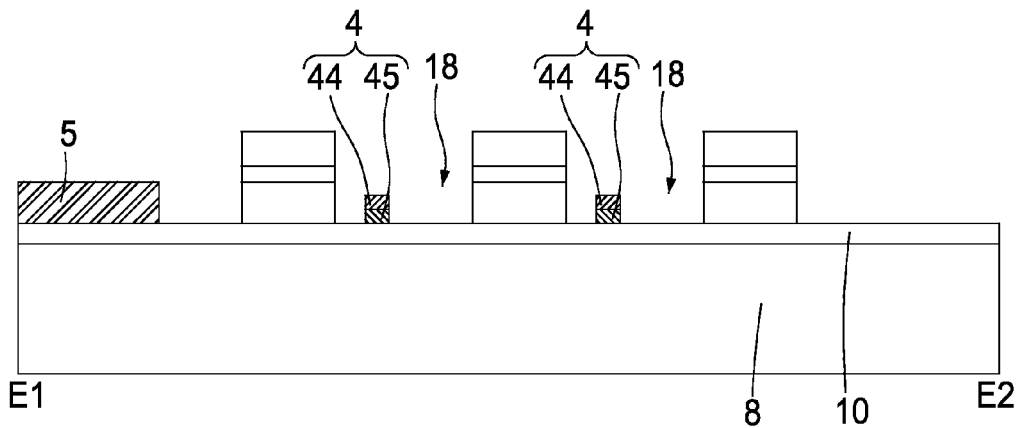

As shown in FIG. 6B, a second electrical pad 5 is on a first side E1 of the substrate 8 and is disposed on the second electrical conducting layer 10 and ohmically contacts with thereof. A second electrode extension 4 is formed in the trenches 18 and ohmically contacts with the second electrical conducting layer 10, wherein the second electrical pad 5 and the second electrode extension 4 are electrically connected to each other. The second electrical pad 5 comprises a single-layer or a multi-layer metallic structure made of Ni, Ti, Al, Au or the combination thereof. The second electrode extension 4 comprises the metal with high electrical conductivity and high reflectivity, e.g. a single-layer or a multi-layer metallic structure made of Al, Au, Pt, Ag, Rh or the alloy of thereof. The second electrode extension 4 can also be formed by coating a reflective layer 44 with higher reflectivity composed of metallic material, e.g. Pt, Ag, Rh or the alloy thereof, on a single-layer or multi-layer metallic structure 45 with high electrical conductivity composed of Ni, Ti, Al, Au or the combination thereof.

Figure 6C:
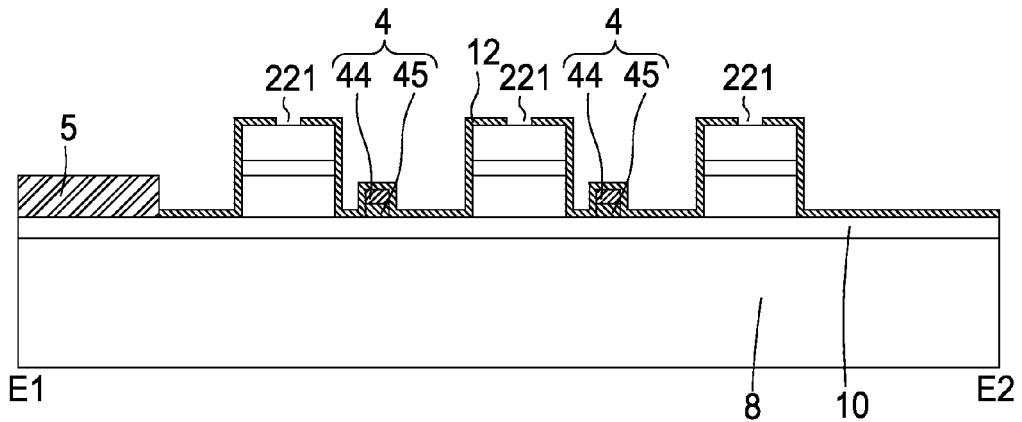

As shown in FIG. 6C, a patterned transparent insulating layer 12 is formed to cover the second electrical conducting layer 10, the plurality of light-emitting semiconductor stacks 2, and the second electrode extension 4 and expose a first surface 221 of each of the plurality of light-emitting semiconductor stacks 2. The transparent insulating layer 12 comprises organic material, e.g. Sub, BCB, PFOB, Epoxy, Acrylic Resin, COC, PMMA, PET, PC, Polyetherimide, Fluorocarbon Polymer; inorganic material, e.g. Silicone, Glass; dielectric material, e.g. $Al_2O_3$, $SiN_x$, $SiO_2$, $TiO_2$, or the combination thereof.

Figure 6D:
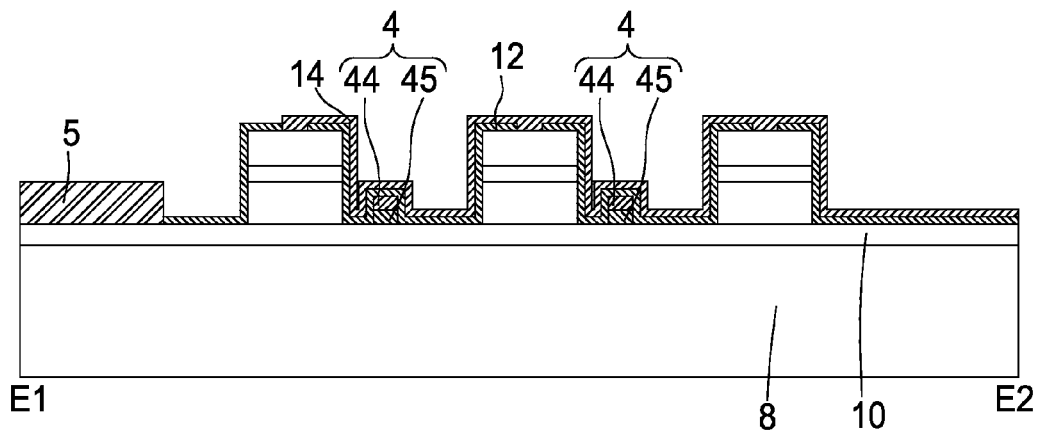

As shown in FIG. 6D, a first electrical conducting layer 14 is formed on the patterned transparent insulating layer 12 and ohmically contacts with the first surface 221 of each of the plurality of light-emitting semiconductor stacks 2. The first electrical conducting layer 14 comprises a transparent conductive layer which is pervious to light. The material of the transparent conductive layer comprises ITO, InO, SnO, CTO, ATO, ZnO, GaP or the combination thereof.

Figure 6E:
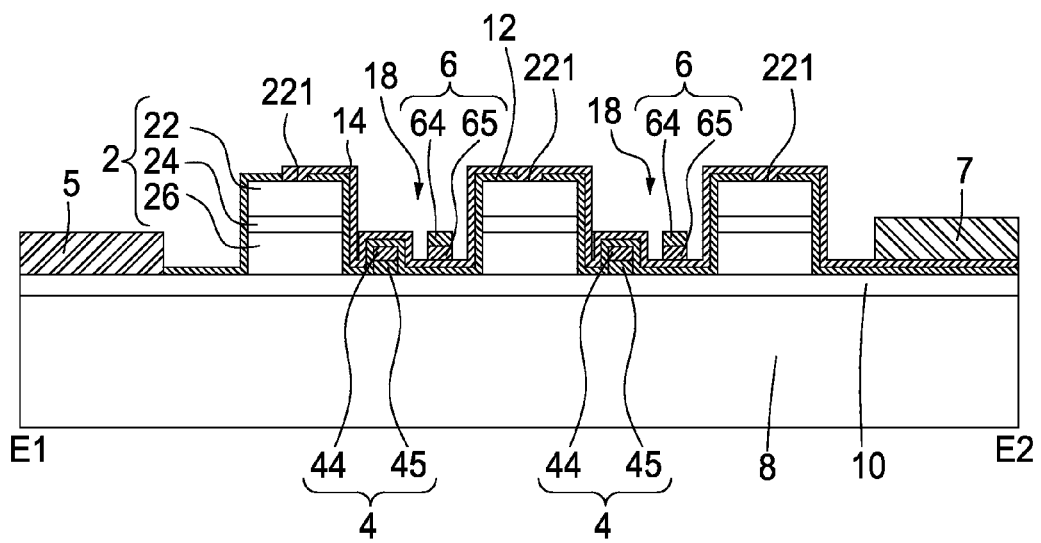

As shown in FIG. 6E, a first electrical pad 7 and a first electrode extension 6 are formed on the first electrical conducting layer 14 and ohmically contact with thereof, wherein the first electrical pad 7 and the first electrode extension 6 are electrically connected to each other. The first electrical pad 7 is on a second side E2 of the substrate 8, and the first electrode extension 6 is in the trench 18. The first electrical pad 7 comprises a single-layer or a multi-layer metallic structure made of Ni, Ti, Al, Au or the combination thereof. The first electrode extension 6 comprises the metal with high electrical conductivity and high reflectivity, e.g. a single-layer or a multi-layer metallic structure made of Al, Au, Pt, Ag, Rh or the alloy of thereof. The first electrode extension 6 also can be formed by coating a reflective layer 64 with higher reflectivity composed of metallic material, e.g. Pt, Ag, Rh or the alloy thereof, on a single-layer or multi-layer metallic structure 65 with high electrical conductivity composed of Ni, Ti, Al, Au or the combination thereof.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting diode structure, comprising:
   a substrate;
   a first light-emitting semiconductor stack on the substrate, wherein the first light-emitting semiconductor stack comprises a first semiconductor layer, a second semiconductor layer with different polarity from the first semiconductor layer, and a light-emitting layer between the first semiconductor layer and the second semiconductor layer;
   a first electrode extension on the substrate, wherein the first electrode extension is apart from the first light-emitting semiconductor stack and electrically connects to the first semiconductor layer;
   an insulating layer under the first electrode extension; and
   a second electrode extension on the substrate and under the insulating layer, wherein the second electrode extension is apart from the first light-emitting semiconductor stack and electrically connects to the second semiconductor layer.

2. A light-emitting diode structure according to claim 1, further comprises a first electrical conducting layer connecting the first electrode extension and the first semiconductor layer.

3. A light-emitting diode structure according to claim 1, further comprises a second electrical conducting layer connecting the second electrode extension and the second semiconductor layer.

4. A light-emitting diode structure according to claim 1, wherein the first electrode extension and the second electrode extension fail to overlap.

5. A light-emitting diode structure according to claim 1, wherein the first electrode extension and the second electrode extension partially overlap.

6. A light-emitting diode structure according to claim 1, further comprising a second light-emitting semiconductor stack, wherein the first light-emitting semiconductor stack and the second light-emitting semiconductor stack are connected in parallel by the first electrode extension and the second electrode extension.

7. A light-emitting diode structure according to claim 6, further comprises a trench between the first light-emitting semiconductor stack and the second light-emitting semiconductor stack, wherein the first electrode extension and the second electrode extension are in the trench.

8. A light-emitting diode structure according to claim 1, wherein the first electrode extension comprises a metallic structure and a reflective layer on the metallic structure.

9. A light-emitting diode structure according to claim 8, wherein the reflectivity of the reflective layer is higher than that of the first electrode extension.

10. A light-emitting diode structure according to claim 8, wherein the reflective layer comprises a distributed Bragg reflector (DBR).

11. A light-emitting diode structure according to claim 8, wherein the reflective layer comprises a metallic material or a distributed Bragg reflector.

12. A light-emitting diode structure according to claim 1, wherein the second electrode extension comprises a metallic structure and a reflective layer on the metallic structure.

13. A light-emitting diode structure according to claim 12, wherein the reflectivity of the reflective layer is higher than that of the second electrode extension.

14. A light-emitting diode structure according to claim 12, wherein the reflective layer comprises a distributed Bragg reflector (DBR).

15. A light-emitting diode structure according to claim 12, wherein the reflective layer comprises a metallic material or a distributed Bragg reflector.

16. A light-emitting diode structure, comprising:
    a substrate;
    a first light-emitting semiconductor stack on the substrate, wherein the first light-emitting semiconductor stack comprises a first semiconductor layer, a second semiconductor layer with different electrical conductivity from the first semiconductor layer, and a light-emitting layer between the first semiconductor layer and the second semiconductor layer; and
    an electrode extension on the substrate,
    wherein the electrode extension is apart from the first light-emitting semiconductor stack and is electrically connected to the first semiconductor layer and
    wherein the electrode extension comprises a metallic structure and a reflective layer on the metallic structure, and the reflective layer comprises metallic material or distributed Bragg reflector (DBR) structure.

17. A light-emitting diode structure according to claim 16, wherein the metallic material comprises Al, Au, Pt, Ag, Rh or the alloy thereof.

18. A light-emitting diode structure according to claim 16, wherein the reflective layer does not contact the substrate.

19. A light-emitting diode structure according to claim 16, wherein the reflective layer is only formed on the metallic structure.

20. A light-emitting diode structure according to claim 19, further comprising an electrical conducting layer between the substrate and the first light-emitting semiconductor stack, wherein the electrical conducting layer comprises metallic material or transparent conductive material.

* * * * *